United States Patent
Tran et al.

(10) Patent No.: US 9,721,859 B2
(45) Date of Patent: Aug. 1, 2017

(54) SEMI-HERMETIC SEMICONDUCTOR PACKAGE

(71) Applicant: Texas Instruments Incorporated, Dallas, TX (US)

(72) Inventors: Andy Quang Tran, Grand Prairie, TX (US); Alok Kumar Lohia, Dallas, TX (US); Reynaldo Corpuz Javier, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/842,535

(22) Filed: Sep. 1, 2015

(65) Prior Publication Data

US 2017/0062297 A1   Mar. 2, 2017

(51) Int. Cl.
*H01L 21/50* (2006.01)
*H01L 23/10* (2006.01)
*H01L 23/00* (2006.01)
*H01L 23/055* (2006.01)

(52) U.S. Cl.
CPC .............. *H01L 23/10* (2013.01); *H01L 21/50* (2013.01); *H01L 24/09* (2013.01); *H01L 24/49* (2013.01); *H01L 24/89* (2013.01); *H01L 23/055* (2013.01); *H01L 2224/08225* (2013.01); *H01L 2224/48237* (2013.01); *H01L 2924/15787* (2013.01); *H01L 2924/1679* (2013.01); *H01L 2924/18301* (2013.01)

(58) Field of Classification Search
CPC ......... H01L 21/50; H01L 23/10; H01L 24/09; H01L 24/49; H01L 24/89

USPC .......................................... 257/690, 693, 701
See application file for complete search history.

(56) References Cited

U.S. PATENT DOCUMENTS

| 6,548,895 B1 * | 4/2003 | Benavides .......... H01L 23/4334 |
| | | 137/594 |
| 9,061,887 B2 | 6/2015 | Lin et al. |
| 2005/0253227 A1 * | 11/2005 | Shoji ....................... H01L 23/10 |
| | | 257/676 |
| 2013/0032905 A1 * | 2/2013 | Lo ............................ B81B 7/007 |
| | | 257/416 |

* cited by examiner

*Primary Examiner* — Ori Nadav
*Assistant Examiner* — Vernon P Webb
(74) *Attorney, Agent, or Firm* — Rose Alyssa Keagy; Charles A. Brill; Frank D. Cimino

(57) ABSTRACT

A method of assembling a semi-hermetic semiconductor package includes bonding a semiconductor die having bond pads to a top side of a base region of a package substrate having vertical side walls that are hollow which define an inner open volume (gap) having an adhesive or thermoplastic material therein. There are a plurality of metal terminals providing top terminal contacts on the top side of the base region and bottom terminal contacts on a bottom side or below the base region. The bond pads are coupled to the top terminal contacts. A lid is placed which provides a top for the semiconductor package, where the lid extends to vertically oriented end protrusions so that the protrusions are positioned within the adhesive or thermoplastic material to secure the protrusions within the adhesive or thermoplastic material to provide a seal for the semiconductor package.

20 Claims, 4 Drawing Sheets

SEMI-HERMETIC SEMICONDUCTOR PACKAGE

FIELD

Disclosed embodiments relate to semi-hermetic semiconductor packages.

BACKGROUND

A semiconductor package comprises a metal, plastic, glass, or ceramic substrate containing one or more semiconductor electronic components such as discrete devices and integrated circuits (ICs). Discrete die regions are typically simultaneously formed on a silicon wafer before being cut into individual die and then assembled in a package. Semiconductor packages protect the die from harm caused by humidity, harmful gases, and various materials used in electronic assembly. Such protection usually takes the form of an essentially airtight environmental seal to prevent moisture travel into the package, referred to herein as a hermetic seal. In the case of a solder-based seal the package is considered hermetic, and for an epoxy seal the seal is considered semi-hermetic. Therefore, a hermetic or semi-hermetic seal as used herein refers to any environmental seal of any enclosed space that houses one or more semiconductor die.

Ceramic packages are commonly used for applications requiring high performance and high reliability. Such packages can generally withstand higher temperatures as compared to traditional plastic packages, and the relatively low coefficient of thermal expansion (CTE) of ceramic materials and the cavity construction also make ceramic packages well suited for stress-sensitive devices such as MEMs sensors. A ceramic package usually includes a base, metal pin I/O contacts (terminals), and a metal or glass frit sea lid (or cover) to protect and seal off the finalized assembly. Plastic materials can also be used for semi-hermetic semiconductor packages.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments describe packaged semiconductor devices (semiconductor packages) which have a package substrate with walls having gaps and lids which include vertically oriented end protrusions (vertical protrusions) which extend into and are secured with the gaps. Disclosed wall designs elongate (lengthen) the moisture travel path into the semiconductor package to reduce the moisture ingress rate into the package. One disclosed embodiments is a method of assembling a semi-hermetic semiconductor package that includes bonding a semiconductor die having bond pads to a top side of a base region of a package substrate comprising a dielectric material which includes vertical side walls that are hollow defining an open volume (gap) having an adhesive or thermoplastic material therein. There are a plurality of metal terminals providing top terminal contacts on the top side of the base region and bottom terminal contacts on a bottom side or below the base region.

The bond pads are coupled to the top terminal contacts, such as by bond wires or a flip chip arrangement. A lid has a top and vertically oriented end protrusions upon placement so that the end protrusions are in the gaps that have adhesive or thermoplastic material secures the protrusions within the adhesive or thermoplastic material to provide a seal for the semiconductor package. Disclosed embodiments thus solve the problem of hermetically sealing semiconductor packages because moisture ingress is reduced by the gap in the side wall of the package with a lid portion therein to provide a longer path length for moisture to travel therein.

BRIEF DESCRIPTION OF THE DRAWINGS

Reference will now be made to the accompanying drawings, which are not necessarily drawn to scale, wherein.

DETAILED DESCRIPTION

Figure 1:
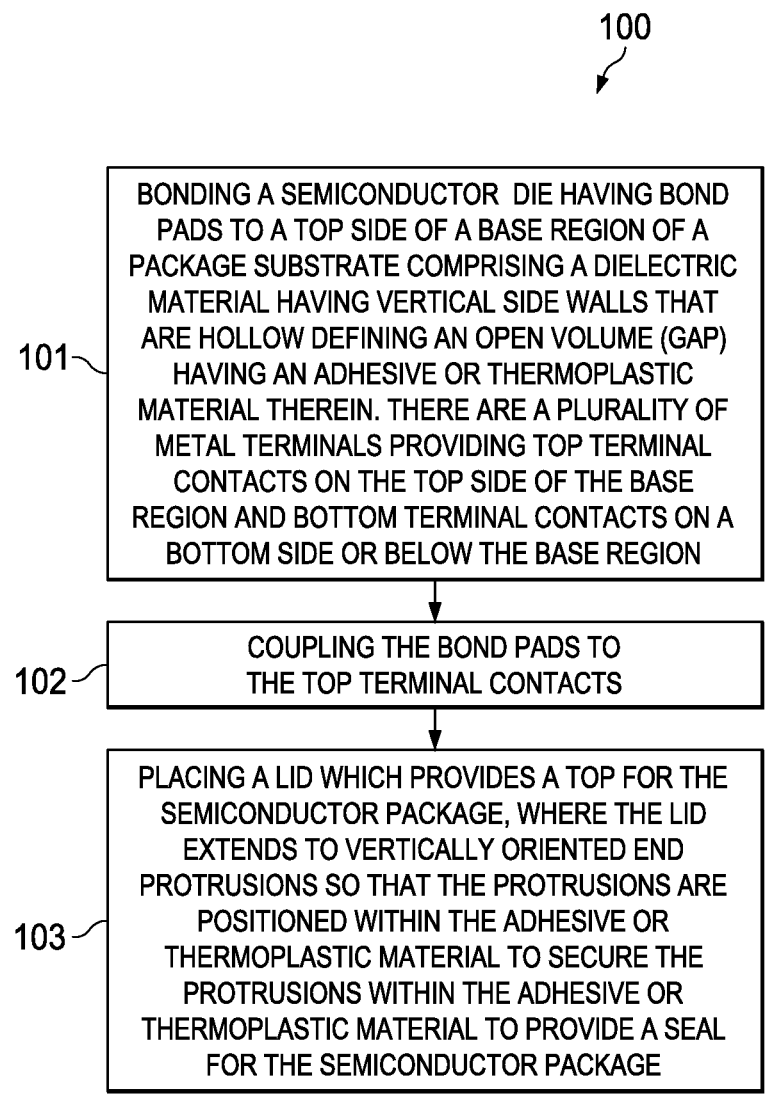
FIG. 1 is a flow chart that shows steps in an example method of assembling a semi-hermetic semiconductor package including placing a lid which include vertical protrusions into the gaps in the walls of the package, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of assembling a semi-hermetic semiconductor package having walls with gaps and a lid which includes vertical protrusions which extend into the gaps, according to an example embodiment. Step 101 comprises bonding a semiconductor die having bond pads to a top side of a base region of a package substrate comprising a dielectric material that includes vertical side walls which are hollow defining an open volume (gap) having an adhesive or thermoplastic material therein. The dielectric material of the substrate is selected to act as a moisture barrier. There are a plurality of metal terminals that provide top terminal contacts on the top side of the base region and bottom terminal contacts on a bottom side or below the base region.

The adhesive or thermoplastic material can be dispensed to fill the gaps or the gaps can be provided with the adhesive or thermoplastic material already inside the gaps. The adhesive can comprise an epoxy resin precursor or other cross linkable material.

The package substrate can comprise a build-up multilayer ceramic substrate. The package substrate can also comprise certain polymer materials such as liquid crystal polymers (LCP) that are known to significantly block the ingress of moisture.

In the case of a ceramic substrate, a build-up can be used to form ceramic side walls having a gap. In the case of a polymer substrate the walls with gaps can be formed using a molding process (e.g., injection molding) with an appropriate mold.

The adhesive can comprise a glue, such as an epoxy or similar sealing material. Epoxy is the cured end product of epoxy resins, as well as a colloquial name for the epoxide functional group. Epoxy typically includes two resin materials that are mixed together before use. Step 102 comprises coupling the bond pads to the top terminal contacts. The bonding can comprises providing bond wires from the bond pads to a top side of the terminals or by a flip chip arrangement.

Step 103 comprises placing a lid which provides a top for the semiconductor package, where the lid extends to vertical protrusions so that the vertical protrusions are positioned within the adhesive or thermoplastic material to secure the vertically oriented end protrusions within the adhesive or thermoplastic material to provide a seal for the semiconductor package. The lid can comprise a metal (or metal alloy) or a glass. In the case of a metal lid, the vertically oriented end protrusions can be punched formed, such as by a machine configured to shape to a cubic thimble. The width of the lid is less than the width of the gaps in the walls to allow the vertically oriented end protrusions to be fit within the gaps, such as the gaps having a width that is 1.1 to 6 times the lid width.

Figure 2:
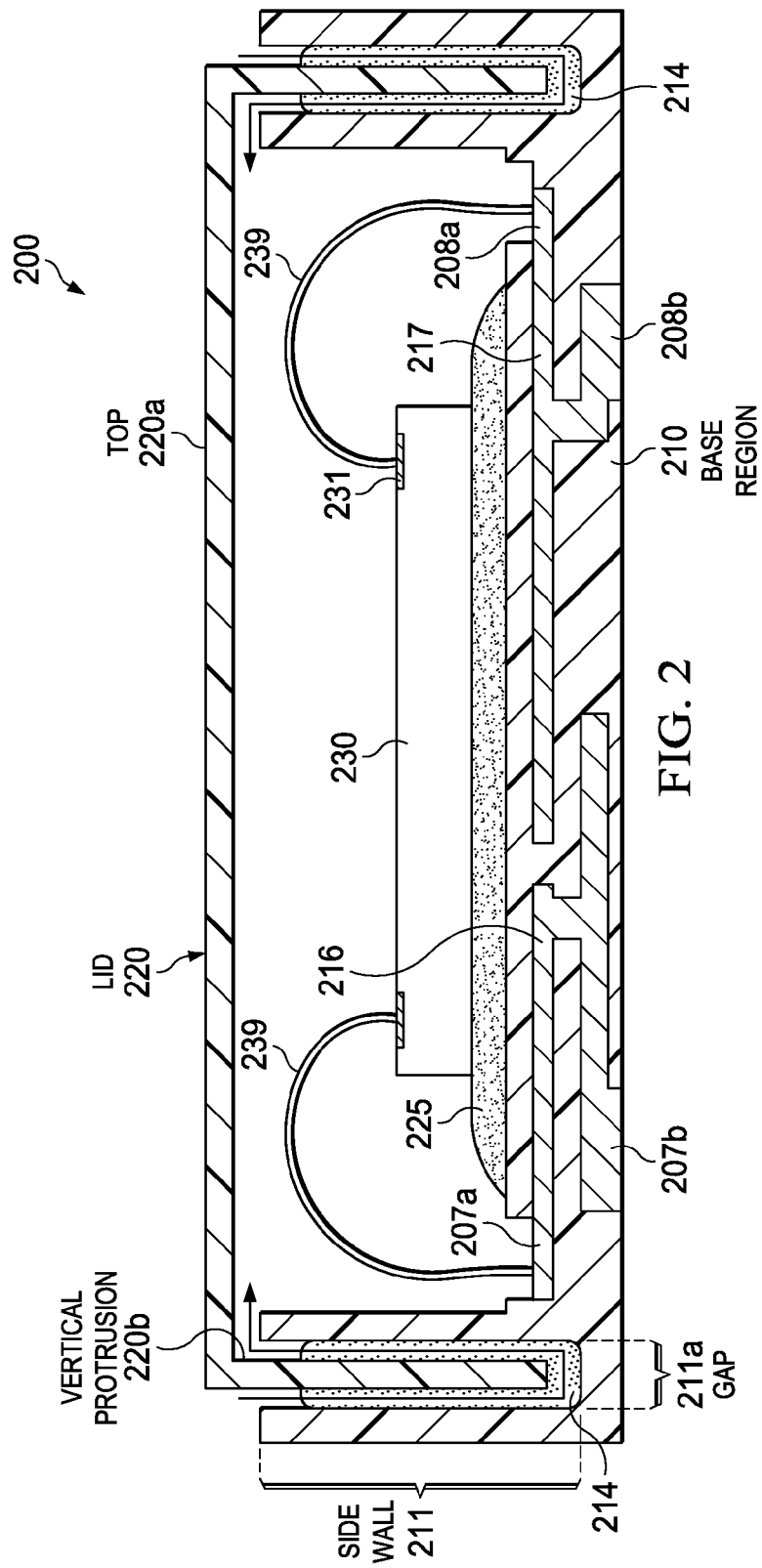
FIG. 2 is a cross sectional view of an example semiconductor package having walls with gaps and a lid which include vertical protrusions which extend into the gaps, embodied as a leadless wire-bonded ceramic package, according to an example embodiment.

FIG. 2 is a cross sectional view of an example semiconductor package 200 having a package substrate providing vertical side walls 211 with an inner open volume shown as gaps 211a, and a lid 220 which include vertical protrusions 220b which extend into the gaps, embodied as a leadless wire-bonded ceramic package, according to an example embodiment. The dielectric material in this embodiment is a ceramic that provides the base region 210 and vertical side walls 211 which define the gaps 211a.

Package 200 includes a plurality of metal terminals providing top terminal contacts 207a, 208a on a top side of the base region 210 and bottom terminal contacts 207b, 208b on a bottom side of the base region 210. There are metal traces 216, 217 connecting the top terminal contacts 207a, 208a to their bottom terminal contacts 207b, 208b through a thickness of the base region 210. A semiconductor die 230 having bond pads 231 is attached to the top side of the base region 210 by a die attach material 225, such as an epoxy. The bond pads 231 are coupled to the top terminals contacts 207a, 208a by bond wires 239.

An adhesive or thermoplastic material 214 is within the gaps 211a. The lid 220 provides a top 220a for the semiconductor package 200 extending to the vertical protrusions 220b that are within the adhesive or thermoplastic material 214 to provide a seal for the semiconductor package 200. The arrows shown depict the route for moisture to enter the package that provides reduced moisture ingress by the gaps 211a in the side wall of the package with the vertical protrusions 220b of the lid 220 within the adhesive or thermoplastic material in the gap 211a, due to the longer path length for moisture to travel therein and thus higher resistance to the flow of moisture therein.

Figure 3:
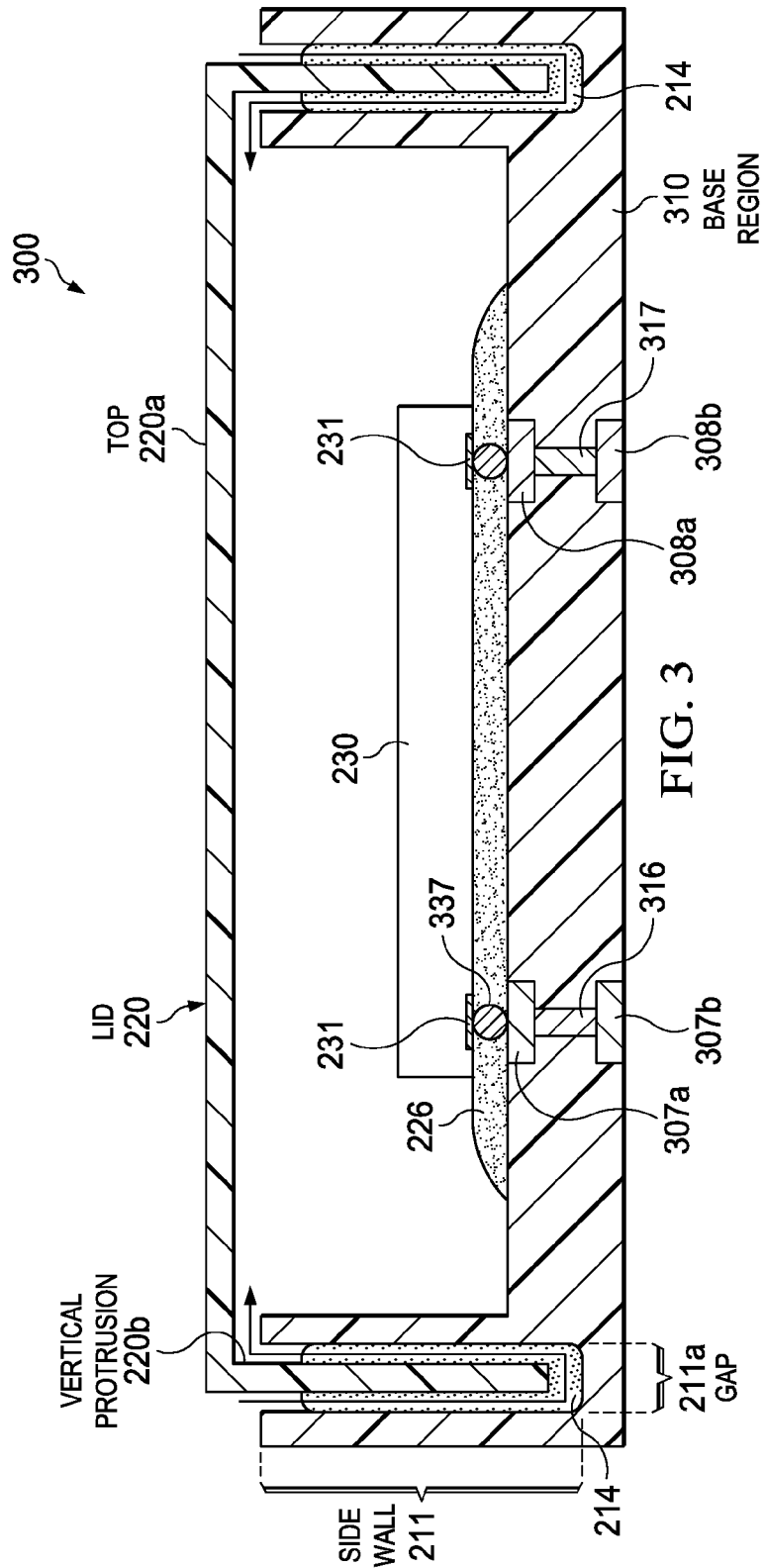
FIG. 3 is a cross sectional view of an example semiconductor package having walls with gaps and a lid which include vertical protrusions which extend into the gaps, embodied as a flip chip package, according to an example embodiment.

FIG. 3 is a cross sectional view of an example semiconductor package having walls 211 with gaps 211a and a lid 220 which include vertical protrusions 220b that extend into the gaps 211a, embodied as a flip chip (FC) package 300, according to an example embodiment. The dielectric material in this embodiment can be ceramic or a moisture blocking plastic such as a liquid crystal polymer.

FC package 300 includes a plurality of metal terminals providing top terminal contacts 307a, 308a on a top side of the base region 310 and bottom terminal contacts 307b, 308b on a bottom side of the base region 310. There are metal connectors 316, 317 connecting the top terminal contacts 307a, 308a to their bottom terminal contacts 307b, 308b through a thickness of the base region 310. The semiconductor die 230 is flip chip attached so that its bond pads 231 are over solder balls 337 that contact the top terminal contacts 307a, 308a on the top side of the base region 310. Underfill 226, such as comprising an epoxy, is shown between the semiconductor die 230 and the top surface of the base region 310. As with package 200, there is adhesive or thermoplastic material 214 is within the gaps 211a, and the lid 220 provides a top 220a for the flip chip package 300 extending to the vertical protrusions 220b that are within the adhesive or thermoplastic material 214 to provide a seal for the flip chip package 300.

Figure 4:
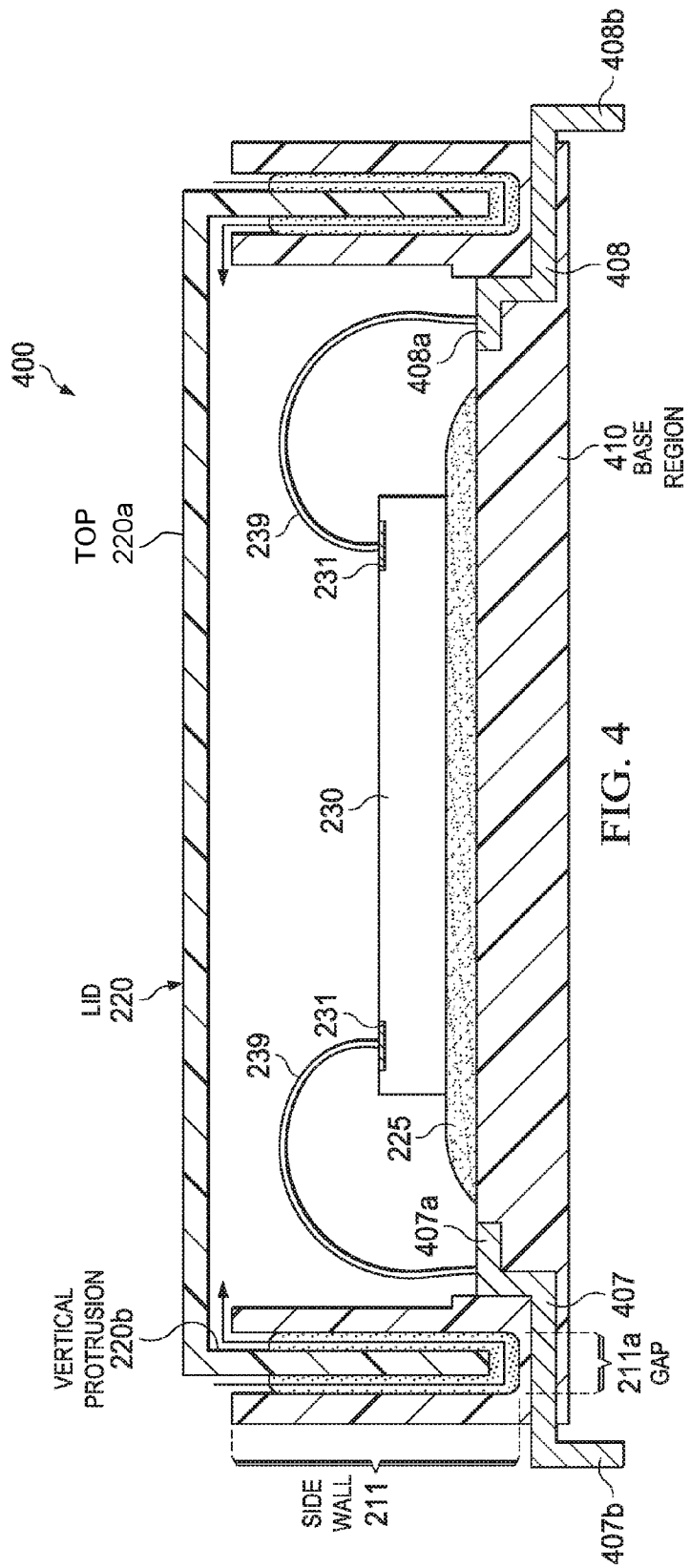
FIG. 4 is a cross sectional view of an example semiconductor package having walls with gaps and a lid which include vertical and protrusions which extend into the gaps, embodied as dual in line package, according to an example embodiment.

FIG. 4 is a cross sectional view of an example semiconductor package having walls 211 with gaps 211a and a lid 220 which include vertical protrusions 220b which extend into the gaps 211a, embodied as a dual in line package (DIP) 400, according to an example embodiment. The dielectric material in this embodiment can be ceramic or a moisture blocking plastic such as a liquid crystal polymer.

DIP package 400 includes a plurality of metal terminals provided with leads 407 and 408 of the leadframe shown having a top terminal contacts 407a, 408a connected to their bottom terminal contacts 407b, 408b through the side wall 211 of the package. The semiconductor die 230 is attached face up with its bottom side attached to the top side of the base region 410 by die attach material 225. Bond pads 231 of the semiconductor die 230 are wire bonded by bond wires 239 to the top terminal contacts 407a, 408a. As with package 200 and LF package 300, there is adhesive or thermoplastic material 214 within the gaps 211a, and the lid 220 provides a top 220a for the DIP package 400 extending to the vertical protrusions 220b that are within the adhesive or thermoplastic material 214 to provide a seal for the DIP package 400.

Disclosed embodiments can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:
1. A semiconductor packaged device, comprising:
  a package substrate comprising a dielectric material including a base region and an inner vertical side wall and an outer vertical side wall forming a gap between an outer surface of the inner vertical side wall and an inner surface of the outer vertical side wall;
a plurality of metal terminals providing top terminal contacts on a top side of said base region and bottom terminal contacts on a bottom side of said base region;
a semiconductor die, having bond pads, said semiconductor die bonded to said top side of said base region;
wherein said bond pads are coupled to said top terminal contacts;
a lid providing a top for said semiconductor packaged device and including a first member and a vertical protrusion extending from the first member, said vertical protrusion located in the gap between the inner side wall and the outer side wall; and
an adhesive or thermoplastic material in the gap and between the outer surface of the inner vertical side wall and the vertical protrusion and an adhesive or thermoplastic material in the gap and between the inner surface of the outer vertical side wall and the vertical protrusion and for providing a seal for said semiconductor packaged device.

2. The semiconductor packaged device of claim 1, wherein said lid comprises a metal or glass and said adhesive or thermoplastic material comprises an epoxy.

3. The semiconductor packaged device of claim 1, wherein said dielectric material comprises a ceramic, further comprising metal traces connecting said top terminal contacts to said bottom terminal contacts through a thickness of said base region.

4. The semiconductor packaged device of claim 1, wherein said dielectric material comprises a polymer.

5. The semiconductor packaged device of claim 1, wherein said bond pads are coupled to said top terminal contacts by bond wires.

6. The semiconductor packaged device of claim 1, wherein said bond pads are coupled to said top terminal contacts by a flip chip arrangement so that said semiconductor package comprises a flip chip package.

7. The semiconductor packaged device of claim 1, wherein said semiconductor package comprises a dual in line package.

8. A semiconductor packaged device, comprising:
a package substrate comprising a ceramic including a base region and an inner vertical side wall and an outer vertical side wall forming a gap between an outer surface of the inner vertical side wall and an inner surface of the outer vertical side wall;
a plurality of metal terminals providing top terminal contacts on a top side of said base region and bottom terminal contacts on a bottom side of said base region;
metal traces connecting said top terminal contacts to said bottom terminal contacts through a thickness of said base region;
a semiconductor die, having bond pads, said semiconductor die bonded to said top side of said base region;
wherein said bond pads are coupled to said top terminal contacts;
a lid providing a top for said semiconductor package and including a first member and a vertical protrusion extending from the first member, said vertical protrusion located in the gap between the inner side wall and the outer side wall; and
an adhesive or thermoplastic material in the gap and between the outer surface of the inner vertical side wall and the vertical protrusion and an adhesive or thermoplastic material in the gap and between the inner surface of the outer vertical side wall and the vertical protrusion and for providing a seal for said semiconductor packaged device.

9. A method of assembling a semiconductor packaged device, comprising:
bonding a semiconductor die having bond pads to a top side of a base region of a package substrate comprising a dielectric material including an inner vertical side wall and an outer vertical side wall forming a gap between an outer surface of the inner vertical side wall and an inner surface of the outer vertical side wall having an adhesive or thermoplastic material in the gap, wherein there are a plurality of metal terminals providing top terminal contacts on said top side of said base region and bottom terminal contacts on a bottom side or below said base region;
coupling said bond pads to said top terminal contacts, and
placing a lid which provides a top for said semiconductor package, said lid including a first member and a vertical protrusion extending from the first member, said vertical protrusion located in the gap between the inner side wall and the outer side wall and so that said vertical protrusion is positioned with said adhesive or thermoplastic material between the outer surface of the inner vertical side wall and the vertical protrusion and with said adhesive or thermoplastic material between the inner surface of the outer vertical side wall and the vertical protrusion for securing said vertical protrusion within said adhesive or thermoplastic material to provide a seal for said semiconductor packaged device.

10. The method of claim 9, further comprising filling said adhesive or thermoplastic material into said gap.

11. The method of claim 9, wherein said adhesive or thermoplastic material comprises an epoxy resin precursor during said placing, further comprising:
curing said epoxy resin precursor after said placing to form an epoxy.

12. The method of claim 9, wherein said adhesive or thermoplastic material comprises a thermoplastic, further comprising heating said thermoplastic before said placing so that said thermoplastic is at a temperature above room temperature during said placing.

13. The method of claim 9, wherein said dielectric material comprises a ceramic.

14. The method of claim 9, wherein said dielectric material comprises a polymer.

15. The method of claim 14, wherein said polymer comprises a liquid crystal polymer.

16. The method of claim 9, wherein said bonding comprises flip chip bonding so that said bonding provides said coupling.

17. The method of claim 9, wherein said coupling comprises wire bonding said bond pads to said top terminal contacts.

18. The semiconductor packaged device of claim 1, wherein each of said outer surface of the inner vertical side wall and said inner surface of the outer vertical side wall comprises a planar surface.

19. The semiconductor packaged device of claim 1:
wherein said vertical protrusion has a width, and
wherein said gap is at least 1.1 times the width.

20. The semiconductor packaged device of claim 1 wherein the inner vertical side wall and the outer vertical side wall extend perpendicularly from the base region.

* * * * *